US011621228B2

(12) United States Patent
Li et al.

(10) Patent No.: US 11,621,228 B2
(45) Date of Patent: Apr. 4, 2023

(54) SUBSTRATE WITH THERMAL VIAS AND SINTER-BONDED THERMAL DISSIPATION STRUCTURE

(71) Applicant: NXP USA, Inc., Austin, TX (US)

(72) Inventors: Lu Li, Gilbert, AZ (US); Lakshminarayan Viswanathan, Phoenix, AZ (US); Freek Egbert van Straten, Mook (NL)

(73) Assignee: NXP USA, Inc., Austin, TX (US)

( * ) Notice: Subject to any disclaimer, the term of this patent is extended or adjusted under 35 U.S.C. 154(b) by 28 days.

(21) Appl. No.: 17/008,221

(22) Filed: Aug. 31, 2020

(65) Prior Publication Data

US 2022/0068817 A1 Mar. 3, 2022

(51) Int. Cl.
| | |
|---|---|
| H01L 23/538 | (2006.01) |
| H01L 21/02 | (2006.01) |
| H01L 21/477 | (2006.01) |
| H01L 23/367 | (2006.01) |
| H01L 23/532 | (2006.01) |

(52) U.S. Cl.
CPC .... *H01L 23/5384* (2013.01); *H01L 21/02109* (2013.01); *H01L 21/477* (2013.01); *H01L 23/3675* (2013.01); *H01L 23/53223* (2013.01); *H01L 23/53228* (2013.01)

(58) Field of Classification Search
CPC combination set(s) only.
See application file for complete search history.

(56) References Cited

U.S. PATENT DOCUMENTS

| | | | |
|---|---|---|---|
| 6,156,980 A * | 12/2000 | Peugh | H01L 23/3677 174/262 |
| 10,104,759 B2 | 10/2018 | Viswanathan et al. | |
| 10,141,182 B1 * | 11/2018 | Molla | H01L 23/427 |
| 10,269,678 B1 | 4/2019 | Viswanathan et al. | |
| 10,431,449 B2 | 10/2019 | Molla et al. | |
| 2019/0021162 A1 | 1/2019 | Viswanathan et al. | |
| 2019/0098743 A1 | 3/2019 | Molla et al. | |
| 2019/0206759 A1 | 7/2019 | Viswanathan et al. | |
| 2020/0251459 A1 | 8/2020 | Tsuda et al. | |

FOREIGN PATENT DOCUMENTS

| | | |
|---|---|---|
| EP | 2760132 A1 | 7/2014 |
| EP | 3567630 A1 | 11/2019 |
| EP | 3657671 A1 | 5/2020 |

OTHER PUBLICATIONS

Jens Muller et al: "Small size LTCC Flipchip-package for RF-powerr application", European Microelectronics and Packaging Conference. Proceedingsof IMAPS, Jun. 15, 2009 (Jun. 15, 2009), pp. 1-4.

* cited by examiner

*Primary Examiner* — Daniel Whalen (57) ABSTRACT

A substrate is described with a thermal dissipation structure sintered to thermal vias. In one example, a microelectronic module includes a recess between first and second substrate surfaces. One or more thermal vias extend between the first substrate surface and the interior recess surface, wherein each of the thermal vias has an interior end exposed at the interior recess surface. A sintered metal layer is in the recess and in physical contact with the interior end of the thermal vias and a thermal dissipation structure is in the recess over the sintered metal layer. The thermal dissipation structure is attached to the substrate within the recess by the sintered metal layer, and the thermal dissipation structure is thermally coupled to the thermal vias through the sintered metal layer.

11 Claims, 6 Drawing Sheets

SUBSTRATE WITH THERMAL VIAS AND SINTER-BONDED THERMAL DISSIPATION STRUCTURE

TECHNICAL FIELD

This invention relates to substrates for electrical circuits, and more particularly to electrical circuit substrates with integrated structures for dissipating heat generated by electrical circuitry.

BACKGROUND

Microelectronic modules containing high power microelectronic devices, such as Radio Frequency (RF) semiconductor die and central processor die, often generate significant heat during operation. For this reason, some microelectronic modules are fabricated to contain copper or other metal structures to conduct heat away from hot spots and to dissipate the heat externally. Elevated localized temperatures can detract from device performance and degrade the reliability of the microelectronic system by accelerating common failure modes, such as solder joint fatigue. One such metal structure used to conduct heat away from hot spots is a metal "slug" or "coin" embedded within a substrate of the module. The substrate may be a coreless substrate, a Printed Circuit Board (PCB) or any other substrate that supports the heat generating die. A slug or coin may also be used as a mounting surface for a heat generating die and as a connection to a ground plane within the substrate.

SUMMARY

According to various embodiments, a substrate is described that includes a solid thermal dissipation structure (e.g., a slug or coin) sintered to one or more thermal vias that are integrally formed within the substrate. In one example, a microelectronic module includes a substrate having a recess over a one or more thermal vias, the thermal via(s) being within the substrate and configured to conduct heat away from a die pad on a mounting surface of the substrate. A layer of sinterable, metal-containing material (or sinter precursor material) is deposited in the recess in physical contact with internal ends of the thermal via(s), and a metal thermal dissipation structure is inserted in the recess in contact with the sinterable layer. After a low-temperature sintering process, the metal thermal dissipation structure is attached to the interior surfaces of the substrate in the recess and to the interior ends of the thermal vias by the now-sintered metal layer.

In another embodiment, a microelectronic module has a substrate having a first substrate surface, a second substrate surface, and a recess in the second substrate surface, wherein the recess is partially defined by an interior recess surface that is between the first and second substrate surfaces. One or more thermal vias extend between the first substrate surface and the interior recess surface, and each of the thermal vias has an interior end exposed at the interior recess surface. A sintered metal layer is in the recess and in physical contact with the interior ends of the thermal vias, and a thermal dissipation structure is in the recess over the sintered metal layer. The thermal dissipation structure is attached to the substrate within the recess by the sintered metal layer, and the thermal dissipation structure is thermally coupled to the thermal vias through the sintered metal layer.

In further embodiments, the substrate includes one or more dielectric layers and one or more conductive layers. In further embodiments, at least some of the thermal vias are filled with sintered metal. In further embodiments, the thermal vias comprise a plurality of vertical structures interconnected with a plurality of horizontal conductive layers. In further embodiments, the thermal vias are configured as at least one of circular, rectangular and bar shapes. In further embodiments, the thermal dissipation structure comprises at least one of copper (Cu), aluminum (Al), and an alloy.

In further embodiments, the thermal dissipation structure comprises a prefabricated solid body having a thermal conductivity that is greater than that of the substrate. In further embodiments, the sintered metal layer is formed from a sinter precursor material of a paste with metal particles of at least one of gold (Au), silver (Ag), and Cu.

Further embodiments include a second recess in the first substrate surface extending from the first substrate surface to the thermal dissipation structure, a thermally conductive die pad in the recess on the thermal dissipation structure, and a die attached to the thermally conductive die pad. Further embodiments include a die pad on the substrate opposite the thermal dissipation structure and thermally coupled to the thermal vias, and a die attached to the die pad.

Some embodiments pertain to a method that includes forming a recess in a substrate over a plurality of thermal vias, the thermal vias being within the substrate and configured to conduct heat, applying a sinter precursor material in the recess so that the sinter precursor material physically contacts at least a portion of the thermal vias, placing a thermal dissipation structure into the recess over the sinter precursor material, and sintering the thermal dissipation structure to at least a portion of the thermal vias.

In further embodiments, forming the recess comprises etching the substrate. In further embodiments, forming the recess comprises sawing the substrate. In further embodiments, placing the thermal dissipation structure comprises applying metal layers sequentially to the sinter precursor material in the recess to form the thermal dissipation structure in place in the recess.

In further embodiments, applying the sinter precursor material comprises screen printing the sinter precursor material. In further embodiments, sintering the thermal dissipation structure comprises baking the substrate and thermal dissipation structure in a reflow oven.

Further embodiments include applying a die attach material to the thermal dissipation structure, applying a die to the die attach material, and sintering the thermal dissipation structure comprises sintering the thermal dissipation structure and sintering the die attach material at the same time.

Some embodiments pertain to a microelectronic module that includes a substrate having thermal vias and a recess over the thermal vias, the thermal vias being within the substrate and configured to conduct heat, a die pad on the substrate and thermally coupled to the thermal vias, a sintered metal layer in the recess in physical contact with at least a portion of the thermal vias, a thermal dissipation structure in the recess over the sintered metal layer and attached to the recess by the sintered metal layer, and a die attached to the die pad and thermally coupled to the thermal dissipation structure through the thermal vias.

In further embodiments, the die is on a surface of the substrate opposite the thermal dissipation structure and the thermal vias are filled with a metal between the die and the thermal dissipation structure through the substrate to thermally couple the die and the thermal dissipation structure.

Further embodiments include a heat sink thermally coupled to the thermal dissipation structure to absorb heat from the die through the thermal vias.

DETAILED DESCRIPTION

While conventional electrical circuit substrates containing embedded metal slugs or coins can provide enhanced local heat dissipation, such substrates are often undesirably costly to manufacture, prone to substrate warpage (particularly in the case of coreless substrates), and associated with other shortcomings. Further, many conventional substrates may be unsuitable for use in microelectronic modules that may experience undesirably high heat concentrations when operated at elevated power levels (e.g., power levels exceeding 1 watt to 10 watts or more, as may be desirable in certain microwave and RF applications).

Embedding metal slugs in a substrate (e.g., a PCB) can be a complex and costly process. For a press-fit coin, for example, it may be difficult to control the coplanarity of the top of the substrate with the top of the coin. There may also be a gap between the sidewalls of the recess in the substrate and the embedded coin. These issues can detrimentally affect the quality of die attach to the substrate or coin.

Embodiments of the present invention may overcome some or all of the deficiencies in conventional electrical circuit substrates. In various embodiments of the present invention, a substrate includes a component mounting surface and an opposite surface, referred to as a "non-mounting" surface. A recess is formed in the non-mounting surface. The recess extends only partially through the substrate, so that the recess is defined by an interior surface that is located between and parallel with the mounting and non-mounting surfaces. Interior sidewalls of the recess extend from the interior surface to the non-mounting surface of the substrate. Conductive thermal vias (e.g., a "via farm" that has a plurality of thermal vias) extend from the mounting surface to the interior surface of the recess in the substrate. As used herein, a via farm refers to a plurality of thermal vias located close together. Some or all of the vias of the via farm may be connected by one or more horizontal conductive layers that run perpendicular to the vias of the via farm as shown, for example, in FIG. 1. In the present description, the via farm is comprised of thermal vias in the form of vertical structures that may be connected by multiple conductive layers as horizontal structures, however the particular orientation may be modified to suit particular embodiments.

"Top ends" of the thermal vias are exposed at and substantially co-planar with the mounting surface of the substrate, and "interior ends" of the thermal vias are exposed at and substantially co-planar with the interior surface of the recess. Sinterable material is dispensed onto the interior surface of the recess and, in some embodiments, also on the interior sidewalls of the recess. A thermal dissipation structure, such as a thermally and electrically conductive coin or slug (e.g., a copper coin/slug) is inserted into the recess in the substrate, and is sinter bonded within the recess over the conductive thermal vias.

The term "substrate" is used herein to refer to any suitable substrate to which an electronic or electrical circuit is attached, including a printed circuit board (PCB), a coreless substrate, a package substrate, a resin substrate, or another suitable substrate. According to various embodiments, the PCB may act as a substrate for an electrical circuit. A PCB includes multiple metal layers, or another type of conductive layer, that are separated by (or interleaved with) dielectric material layers (e.g., sheets of composite fiber weave pre-impregnated with a thermosetting epoxy resin, sometimes referred to as "pre-preg"). Conductive vias which extend through the dielectric material layers provide for electrical connectivity between the metal layers. The methods and apparatus described herein apply both to substrate technology (such as may be used in RF module products) and PCB technology (such as may be used for device and component mounting).

The term "recess" is used herein to refer to an opening in a surface of a substrate that may or may not extend all the way through the substrate to the opposite surface. As described in the embodiments herein, a thermal dissipation structure (e.g., a "coin" or "slug") is a distinct conductive structure that is sinter bonded in a recess in a substrate. The terms "coin" and "slug" may be used interchangeably herein and, to the extent that these terms refer to different structures, either or both structures may be applied to the embodiments described herein.

The terms "electrically coupled" and "thermally coupled" are used herein to refer to an electrical or thermal flow path between the two objects that are described as electrically or thermally coupled. The two coupled objects may be directly connected or attached or connected through one or more intermediate structures that also permit electrical or thermal flow.

In some embodiments, a thermal dissipation structure is configured to have a high thermal conductivity (TC). The thermal dissipation structure may be composed of a metallic material, a non-metallic material, or a composite material including materials suitable for a heatsink. In an embodiment, a thermal dissipation structure assumes the form of a slug, coin, plate, or block composed predominately or essentially entirely of a metal or alloy, such as copper (Cu), aluminum (Al), or other suitable materials and having a thermal conductivity exceeding that of the substrate. A thermal dissipation structure may have a monolithic or layered structure that may be plated or clad with another metal or roughened to promote bonding with a sintered metal during a sintering process. A thermal dissipation structure may have a thickness much greater than the metal layers of a substrate to evenly spread dissipated heat energy across the thermal dissipation structure.

The various embodiments may have several advantages. First, having the thermal vias extend to the component mounting surface of a substrate helps to ensure coplanarity of the top ends of the thermal vias with the mounting surface. When the top ends of the thermal vias are coplanar with the mounting surface of the substrate, the quality of subsequent packaging and other operations may be improved. Second, the size and thickness of the metal thermal dissipation structures may be adjusted based on cost and heat dissipation objectives among other factors. Sinter-bonding thermally conductive thermal dissipation structures in the substrate may ensure effective heat dissipation and at the same time reduce the cost of raw material and the cost of manufacturing processes. Third, low-temperature sintering processes may reduce warping of the substrate or PCB that may otherwise occur when higher-temperature processes are used.

Further still, attaching components to a component mounting surface of a substrate over the thermal vias early in a fabrication sequence may reduce the number of steps in the manufacturing process and may reduce the cost associated with performing the process. In some embodiments, the die and die attach material or devices/components and mounting material are put in place before the low temperature sintering process and before the thermal dissipation structure is sintered within the recess in the substrate. After the sintering process, the thermal dissipation structure is securely attached to the substrate and also attached through the sintered material to the interior ends of the thermal vias. Alternatively, or in addition, die attach and devices/components mounting processes may be completed after the sintering process. As an additional potential advantage, substrates that include a thermal dissipation structure sinter bonded to thermal vias may have over 40% reduced system thermal resistance, when compared with substrates that include only thermal vias.

As described herein, the advantages of both thermal vias and of metal thermal dissipation structures are combined by sinter-bonding the metal thermal dissipation structures in a substrate or a PCB that includes thermal vias. Sinter-bonding is a low temperature process that is highly efficient and cost effective. Use of sinter-bonding also mitigates potential issues in high temperature processing, such as substrate or PCB warpage.

Figure 1:
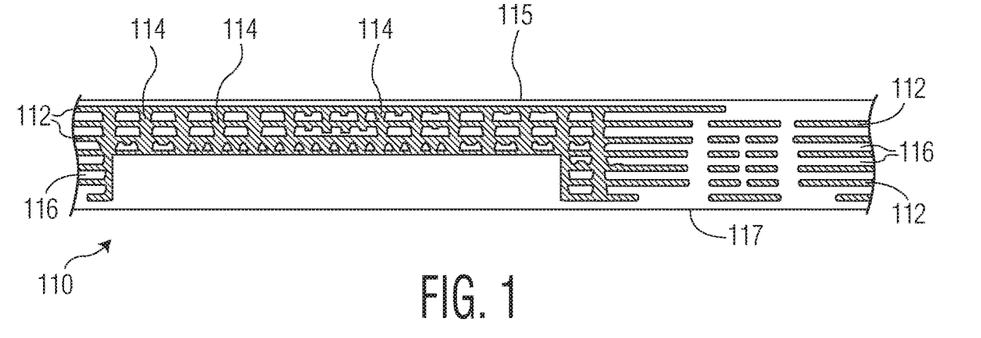
FIG. 1 is a cross-sectional side view diagram of a substrate with a plurality of thermal vias in accordance with an embodiment of the invention.

FIGS. 1-6 illustrate several sequential steps of manufacture of a first embodiment of a substrate with thermal vias and a sinter-bonded metal thermal dissipation structure. In accordance with a first embodiment, FIG. 1 is a cross-sectional side view diagram of a substrate 110 at a first manufacturing step, where the substrate 110 has a plurality of thermal vias 114, such as vertical bar and/or circular vias. The substrate 110 has a mounting surface 115 (or "top surface") and an opposed non-mounting surface 117 (or "bottom surface"), and may assume any form suitable for serving as a support structure for an electrical circuit (e.g., including a die and other components) and to which a metal thermal dissipation structure (e.g., structure 124, FIG. 6) may be sinter bonded, as described below. In some embodiments, the substrate contains conductive layers 112, such as upper and interior patterned metal layers that are electrically and thermally conductive. One or more of the conductive layers 112 may be patterned to form electrical routing features or to provide a thermal connection between different objects. Such a substrate may be fabricated as a multi-layer PCB in which multiple dielectric (e.g., pre-preg) layers are successively built-up using a lamination process, with patterned conductive layers being formed between and/or on each dielectric layer. Alternatively, for a coreless substrate, multiple build-up layers may be successively formed over a temporary carrier, which is subsequently removed after completion of the build-up process. In some embodiments, the build-up layers are formed within or around a stiffener, such as a metal or ceramic ring.

A multilayer coreless substrate may be thinner than a multilayer PCB but more prone to warpage during high temperature processing. In some embodiments, thinner single layer PCB or coreless substrates are used that do not have internal patterned conductive layers. In some embodiments, an interposer, or another dielectric structure may be used as the substrate or added to the complete system. In some embodiments, the substrate may be produced by a panelization process in which a Redistribution Layer (RDL) containing interconnect lines is produced over a molded panel, which is subsequently singulated into discrete units. In still other embodiments, the substrate may include ceramic dielectric layers with patterned conductive layers therebetween, and the assembly may be co-fired to produce the substrate. In the illustrated example, the substrate 110 is shown as a multi-layer organic substrate which includes a plurality of conductive layers 112, such as patterned metal layers, that are separated by (or interleaved with) a plurality of dielectric material layers 116.

The substrate may include a variety of different electrically and thermally conductive structures, such as vias. In some embodiments, particularly in the area of the conductive layers 112, the conductive vias may provide power and/or signal transfer through the module substrate. The power and/or signal vias may be connected to the conductive layers 112, to traces or to interconnect lines within the wiring layers. According to various embodiments, the conductive vias also include thermal vias 114 in one or more areas in which circuitry, e.g., die 134 (FIG. 7), that produce significant heat during operation are to be mounted in subsequent manufacturing steps.

Some die, such as amplifier die for RF communication, include high power transistors that may produce significant amounts of heat during operation. In addition, some die may also need access to a ground reference (e.g., to a system ground plane). Accordingly, in an embodiment, the substrate 110 may also include additional ground plane and heat sink structures (not shown). According to an embodiment, exposed, outer metal layers are utilized to provide die attach pads and/or conductive landing pads for wire bond leads of an attached die.

Some conductive layers 112 of the substrate 110 may be used to convey DC (Direct Current) voltages (e.g., DC bias voltages) and to provide access to a system ground reference. Other layers may be used to convey RF and other signals. Additionally, another patterned metal layer may be formed on a surface of the substrate that includes a plurality of conductive contacts and traces on the surface, which facilitates electrical connection to a die and other components that may be coupled to and mounted to the surface.

Figure 2:
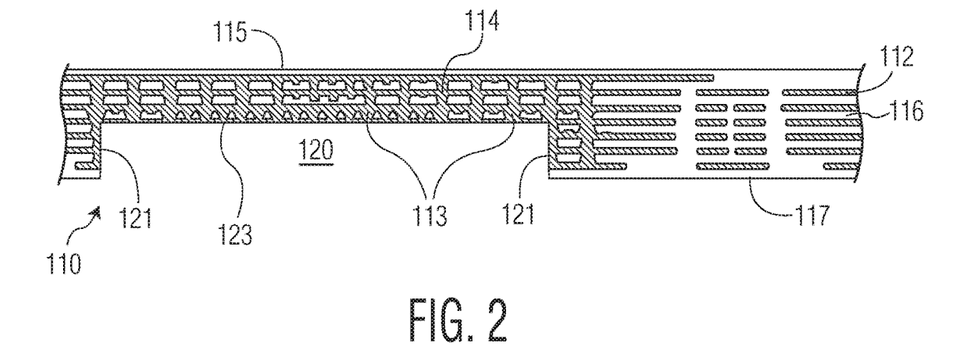
FIG. 2 is a cross-sectional side view diagram of a slice of the substrate with a recess formed in the substrate in accordance with an embodiment of the invention.

FIG. 2 is a cross-sectional side view diagram of a slice of the substrate in a subsequent manufacturing step after a recess 120 has been formed through the non-mounting surface 117 where the recess 120 exposes "interior ends" 113 of the thermal vias 114. The diagram shows only a slice of the substrate 110 so that the recess 120 appears open with no back side wall. While, in some embodiments, the recess 120 may extend horizontally across an entirety of the non-mounting surface 117 of the substrate 110 as it appears in the drawing. In other embodiments, the recess will have interior sidewalls 121 on all four sides and not only the two sides as shown. The recess 120 is defined by interior sidewalls 121 and an interior surface 123 at which the interior ends 113 of the thermal vias 114 are exposed. While the recess 120 is shown as rectangular, any other suitable shape or configuration may be used.

Figure 3:
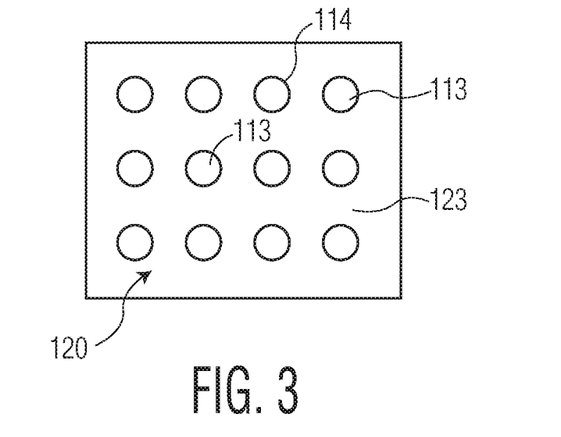
FIG. 3 is a bottom plan view diagram of the ends of multiple thermal vias in a recess of a substrate in accordance with an embodiment of the invention.

For example, FIG. 3 shows a bottom-up plan view of an embodiment of a recess 120, with interior ends 113 of a plurality of thermal vias 114 that are circular and exposed at the interior surface 123 of the recess 120. As will be discussed in more detail later, the thermal vias 114 may be filled with conductive material at this point in the fabrication process, or the thermal vias 114 may be unfilled or lined with a conductive material (e.g., filling 220, FIG. 12). Further, the thermal vias 114 may have circular cross-sections, as shown in FIG. 3, or the thermal vias 114 may have other cross-sectional shapes.

Figure 4:
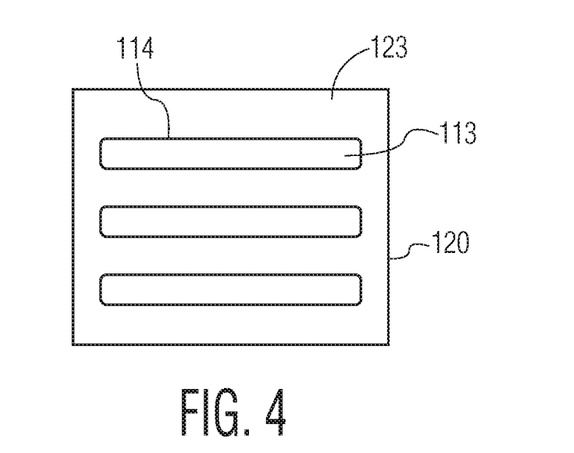
FIG. 4 is a bottom plan view diagram of the ends of multiple alternative thermal vias in a recess of a substrate in accordance with an embodiment of the invention.

As shown in FIG. 4, for example, which shows a bottom-up plan view of the recess 120 according to another embodiment. The thermal vias 114 are configured as "bar vias", which have significantly longer cross-sectional lengths than cross-sectional widths (e.g., the cross-sectional lengths may be 5 or more times the cross-sectional widths). Interior ends 113 of the thermal vias 114 shown in FIG. 4 are exposed at the interior surface 123 at the top of the recess 120 and the thermal vias 114 may be filled, unfilled, or lined with a conductive material. Although FIGS. 3 and 4 show thermal vias 114 as having certain numbers and arrangements of circular and bar shapes, more or fewer thermal vias 114 may be included, and/or the arrangement of the thermal vias 114 may be different.

Figure 6:
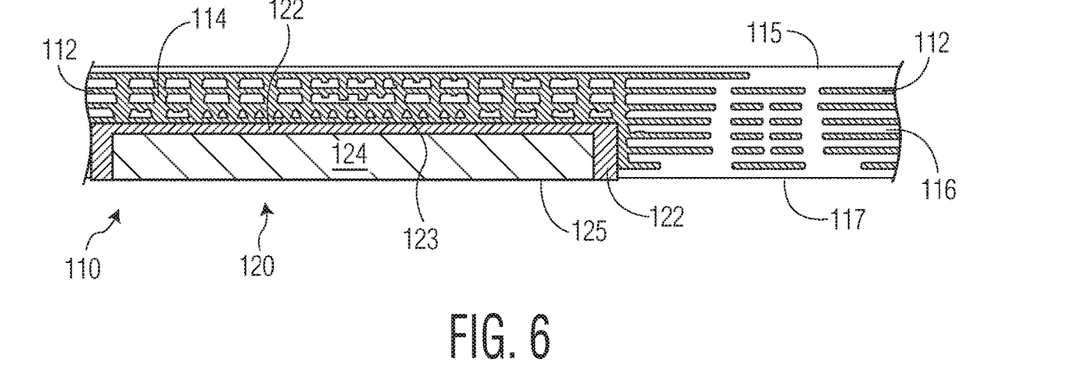
FIG. 6 is a cross-sectional side view diagram of the substrate with a thermal dissipation structure placed in the recess in accordance with an embodiment of the invention.

The recess 120 may be in a form to accommodate a thermal dissipation structure 124 (e.g., a slug or coin, as shown in FIG. 6). It may be formed in a central portion of the substrate 110 as shown or in any other location. Further, more than one recess 120 and thermal dissipation structure 124 may be included in the substrate 110. The location, shape, dimensions, and the number of recesses formed in the substrate may be adapted to suit different end products. The recess 120 may be produced in-situ during the PCB lamination process or after the substrate is fully formed using a material removal process, such as by laser cutting, sawing, etching, or by mechanical drilling.

The interior sidewalls 121 of the substrate 110 that define the recess 120 may be left bare or instead partially or wholly plated with a metallic (e.g., Au, Ag, Cu) film for enhanced mechanical connection or electrical conductivity. The recess 120 dimensions (e.g., width, length, or diameter) may be adapted to accommodate a thermal dissipation structure 124 that has a larger or smaller horizontal dimension than the footprint of an intended die to be mounted over the thermal dissipation structure 124. The dimensions may be adapted to suit a particular thermal dissipation structure 124 and may have any suitable shape, such as cubic, cylindrical, ovular, racetrack, circular, and more complex polygonal shapes, to list but a few examples.

Figure 5:
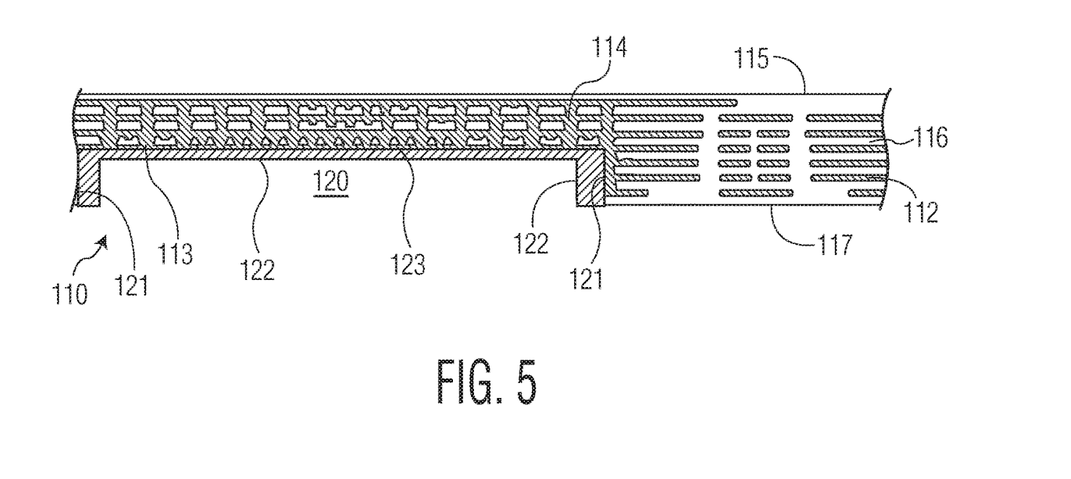
FIG. 5 is a cross-sectional side view diagram of a slice of the substrate with a recess and a sinter precursor material in the recess in accordance with an embodiment of the invention.

In a subsequent manufacturing step, and as shown in FIG. 5, a sinter precursor material 122 is applied in the recess 120 so that the sinter precursor material 122 physically contacts at least the interior sidewalls 121, the interior surface 123, and the interior ends 113 of the thermal vias 114. While in this cross-sectional side view of a slice of the substrate only two interior sidewalls 121 are shown, in some embodiments, there may be three or four sidewalls. In other words, in this example, the sinter precursor material 122 contacts the portion of the thermal vias 114 that are exposed at the interior surface 123 of the recess 120. As the sinter precursor material 122 is applied, any portions of the thermal vias 114 that are exposed by the recess 120 receives the sinter precursor material 122. The recess 120 may be described herein as being "over" the thermal vias 114, and the sinter precursor material 122 may be described herein as being "over" the recess, the interior surface 123 of the recess 120, or the interior sidewalls 121 of the recess 120. While the diagram shows the sinter precursor material 122 as being beneath the thermal vias 114 the drawing may be inverted.

The sinter precursor material 122 may be formulated to form relatively robust metallurgical bonds with (e.g., metallized) surfaces of the substrate after the sintering process, such as plated copper (Cu) or other plate metal layers formed on selected substrate surfaces (including surfaces of the thermal vias 114). The sinter material may also be formulated to have a relatively high ductility reducing the likelihood of bond separation or cracking through thermal cycling. The sinter material may be formulated to have a controlled (e.g., near zero or greater) porosity.

The particular composition of the sinter precursor material 122 may be modified to suit different applications. Generally, sintered bond layers may be predominately composed of a binder and particles of at least one metal, as considered by weight percentage (wt. %), such as particles of Cu, Ag, Au, or a mixture thereof. The sintered bond layers may or may not contain organic materials. In some embodiments, the sintered material contains less than 1 wt. % of organic materials. Alternatively, organic fillers may be used such as an epoxy to reduce the likelihood of crack formation and propagation across thermal cycles. A sintered layer may have a thermal conductivity exceeding about 30 watts per meter-Kelvin (W/mK), preferably exceeding about 50 W/mK, and more preferably exceeding about 70 W/mK. The porosity of a bond layer may also be controlled and, in certain embodiments, may be less than 1% and, perhaps, less than 0.5% by volume. In some embodiments, the porosity may range from 0% to 30% by volume. The thickness of the metal sinter layers may be adapted to suit different applications, but may have thicknesses that range between about 5 micrometers (µm) and about 100 µm and, preferably, between about 15 µm and about 35 µm in one exemplary and non-limiting implementation. In another embodiment wherein the metal sinter layers are composed of essentially pure Ag or Cu, the metal sinter layers may have a thickness range from about 40 µm to about 100 µm.

In another embodiment, the metal particles contained within the sinter precursor material consist essentially of Au, Ag and/or Cu particles. The metal particles contained within the precursor material may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be used during the module, daughtercard, device board, or electronics system fabrication process.

The metal particles contained within the precursor material may have any shape or combination of shapes including, but not limited to, spherical shapes, oblong shapes, and platelet or laminae shapes. The average dimensions of the metal particles will vary in conjunction with particle shape and process parameters. In some embodiments, the average maximum dimension of the metal particles (e.g., the diameter of the metal particles when spherical or the major axis of the metal particles when oblong) may be between about 100 µm and about 10 nanometers (nm). In other embodiments, the metal particles may have an average maximum dimension greater than or less than the aforementioned range. In certain implementations, a mixture of metal particles having average maximum dimensions in both the nanometer and micrometer range may be present within the precursor material. In other implementations, only nanoparticles (that is, particles having average maximum dimension between 1 and 1000 nm) may be contained within the sinter precursor material. As a specific, albeit non-limiting example, the precursor material may contain at least one of Ag, Au, or Cu nanoparticles or micron-sized particles in an embodiment, with Ag or Cu nanoparticles preferred.

The sinter precursor material 122 may be applied in various different manners including both wet state and dry state application techniques. Suitable wet state application techniques include, but are not limited to, screen or stencil printing, doctor blading, spraying, dipping, and fine needle dispense techniques. When a wet state application technique is employed, a flowable or wet state coating precursor material is initially obtained by, for example, independent production or purchase from a third party supplier. In addition to metal particles (described above), the wet state coating precursor material contains other ingredients (e.g., a solvent and/or surfactant) to facilitate wet set application, to adjust the viscosity of the precursor material, to prevent premature agglomeration of the metal particles, or to serve other purposes.

In one embodiment, the wet state coating precursor material contains metal particles in combination with a binder (e.g., an epoxy), a dispersant, and a thinner or liquid carrier. The volume of solvent or liquid carrier contained within the coating precursor material may be adjusted to tailor the viscosity of the sinter precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process may be carried out to remove excess liquid from the sinter precursor material, if so desired.

In further embodiments, the sinter precursor material may be applied using a dry state application technique. For example, a film transfer process may be employed to apply the precursor material to the appropriate component surfaces. In this regard, a dry film may first be prepared by, for example, initially depositing (e.g., screen printing or otherwise dispensing) one or more sinter precursor materials onto a temporary substrate or carrier, such as a plastic (e.g., polyethylene terephthalate) tape backing. The sinter precursor material may be applied to the carrier in a wet, flowable state and then heated or otherwise dried to yield a dry film, which is transferred to the appropriate package component surfaces. Heat, pressure, or both heat and pressure are then applied to adhere the metal particle-containing precursor layer (dry film) to the appropriate component surfaces. The carrier (e.g., tape backing) may then be removed by physical removal (e.g., peeling away) or by dissolution in a chemical solvent. This process may then be repeated to apply additional sinter precursor materials to other component surfaces, as appropriate. In still further embodiments, one or more freestanding films may simply be positioned between the microelectronic module components during stacking or build-up also referred to as film transfer.

FIG. 6 is a diagram of the substrate 110 after a thermal dissipation structure 124 has been placed in the recess 120 over the sinter precursor material 122. The thermal dissipation structure 124 (e.g., a solid slug or coin) is selected from materials with a high thermal conductivity, such as metals, such as Cu and Al, or alloys or composites. For die or device mounting as described below with reference to FIGS. 7 and 10, the thermal expansion of the thermal dissipation structure 124 may be matched to the die or device to reduce stress on the die or device. The thermal dissipation structure 124 may have a planform shape and dimensions substantially matching those of the recess 120 in the substrate. Stated differently, the thermal dissipation structure 124 may be shaped and sized for thermal and electrical mating reception in the recess 120. The thermal dissipation structure 124 is placed over the sinter precursor material 122 so that, after sintering, the thermal dissipation structure 124 bonds to the thermal vias and to the interior surface of the substrate recess 120 with a robust metallurgical bond.

Alternatively, the thermal dissipation structure 124 may be formed in-situ in the recess. In some examples, the substrate is masked except around the recess 120 and layers of conductive material are applied to the recess 120 to build up the intended thickness of the thermal dissipation structure 124. In some embodiments, plating is used in steps to fill the recess 120 to the desired thickness for the thermal dissipation structure 124. According to an embodiment, the thermal dissipation structure 124 has a height that is substantially equal to the height of the recess 120 (i.e., the vertical dimension between the substrate non-mounting surface 117 and the interior surface 123 of the recess 120), so that an outer surface 125 of the thermal dissipation structure 124 is exposed and substantially co-planar with the non-mounting surface 117 of the substrate 110.

With the thermal dissipation structure 124 inserted as shown in FIG. 6, the assembly that includes the substrate 110 and the thermal dissipation structure 124 may be sintered as described herein to attach the thermal dissipation structure 124 to the substrate in the recess. This provides a substrate with enhanced strength and thermal conduction. The non-mounting surface 117 on a bottom of the structure of FIG. 6 including the outer surface 125 on a bottom of the thermal dissipation structure 124 may also be planarized by sawing, grinding, CMP (Chemical Mechanical Planarization) or another technique. The advantages of high heat conduction and optional ground plane connection are offered also with the substrate structure of FIG. 6.

Figure 7:
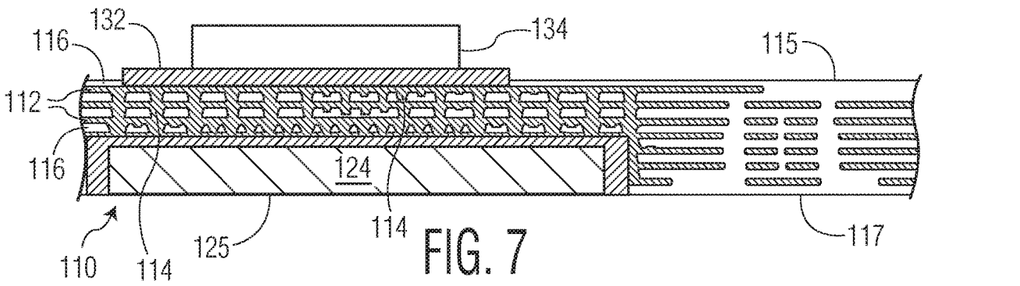
FIG. 7 is a cross-sectional side view diagram of the substrate with a thermal dissipation structure placed in the recess and a die mounted over the thermal vias and thermally coupled to the thermal dissipation structure in accordance with an embodiment of the invention.

As shown in FIG. 7, a die 134 may be attached to the opposite side of the substrate 110 (i.e., to the mounting surface 115) from the thermal dissipation structure 124, shown here as the top side, as described also with reference to FIGS. 11 to 14. As shown in FIG. 7 a device bond layer 132, which may more specifically be a die attach material, is deposited over the thermal vias 114 on the mounting surface 115. Any top layers that have been deposited over the top ends of the thermal vias 114 may be removed by etching, polishing or another technique. Alternatively, conductive paths may be applied between the mounting surface 115 on a top side of the substrate 110 and the thermal vias 114 to provide thermal conduction. As shown, the device bond layer 132 may be physically attached through any top layers of the substrate 110 to the thermal vias 114 for thermal conduction through the device bond layer 132.

A die 134, such as a microelectronic device physically contacts and is bonded to the thermal vias 114 near the mounting surface 115 at the top of the substrate by the device bond layer 132. In some embodiments, the device bond layer 132 may be composed of a non-sintered material, such as a die attach epoxy, or a sinter precursor material, which is similar or substantially identical to the layer that attaches the thermal dissipation structure 124 to the substrate 110.

The device bond layer 132 may be applied as a patterned layer (e.g., as an applied film or as a deposited paste layer) over the mounting surface 115 of the substrate 110 or in another suitable way, depending on the implementation. If needed in some embodiments, additional thermal vias or bars may be inserted through the mounting surface 115 to contact the thermal vias 114 of the substrate 110. Alternatively, a dielectric material layer 116 on the mounting surface 115 may be etched away and the device bond layer may be applied over and in contact with the thermal vias 114. The die may have a solid or patterned conductive layer on its bottom surface (i.e., the surface that faces the device bond layer 132) to electrically connect with the device bond layer 132 and with respective ones of the vias 114 underlying the device bond layer 132. The device bond layer is configured to have a high thermal conductivity so that it is able to conduct heat away from a microelectronic device (e.g., die 134, FIG. 7). Other suitable bonding materials include solder materials, thermally-conductive die attach materials, metal-filled epoxies, and sintered metallic materials. When used for device bond layer 132, a solder material may be reflowed at the same time that other solder contacts used to electrically connect other microelectronic components are reflowed.

As shown in FIG. 7, a die 134 is placed over the device bond layer 132. When the device bond layer 132 includes a sinter precursor material, the assembly may be subjected to a sintering process to simultaneously bond the thermal dissipation structure 124 to the substrate 110 and to bond the die 134 to the device bond layer 132 and to the thermal vias 114 on the mounting surface 115 of the substrate 110. Otherwise, an appropriate process is carried out to attach the die 134 to the substrate. In some embodiments, the die 134 has a thermally conductive layer on its mounting surface (e.g., the above-described conductive layer) that is physically connected to the device bond layer 132. The device bond layer 132 forms a thermally conductive die pad that physically contacts the ends of the thermal vias 114. The thermal vias 114 are also thermally connected to the thermal dissipation structure 124 so that the thermal dissipation structure 124 is able to operate as a heat sink for the die 134. One or more microelectronic devices including die, discrete components and passive components may be mounted to the same or to another surface of the substrate and to thermal vias that are in thermal communication with the thermal dissipation structure 124 or other thermal dissipation structures (not shown) in other portions of the substrate 110. An additional heatsink (not shown) may be attached to the non-mounting surface 117 and to the outer surface 125 of the thermal dissipation structure 124 to absorb and dissipate heat conveyed through the thermal vias 114 and the thermal dissipation structure 124.

Die 134 may be, for example, a semiconductor die having one or more active devices (e.g., power transistors) and an active surface (e.g., top surface in FIG. 7) on which one or more groups (e.g., rows or clusters) of bond pads are located. The bond pads may be electrically coupled to electrically-conductive traces and/or bond pads formed in or on the substrate by wire bonds (e.g., wire bond 361, FIG. 15). Other electrical interconnection approaches may be used to suit different applications. Additional microelectronic modules, die, and/or devices may be attached to the same mounting surface 115 and/or to additional thermal vias (not shown) or to other surfaces on the same substrate as a multiple die module or System-in-Package (SiP) configuration. Attached die and devices may include one or more of a processor, a controller, an RF front-end, a signal processor, a memory die, an Application Specification Integrated Circuit (ASIC) die, a Microelectromechanical Systems (MEMS) device, and a Surface Mount Device (SMD), such as discrete or passive capacitors (e.g., chip caps), inductors, resistors, and diodes, inter alia.

Various other structural features may be added to the substrate 110 in further embodiments. For example, a lid may be positioned over the substrate to enclose the microelectronic device. Alternatively, an encapsulant may be formed over the substrate and around the die. Other sintered metal structures may also be produced, if desired.

Figure 8:
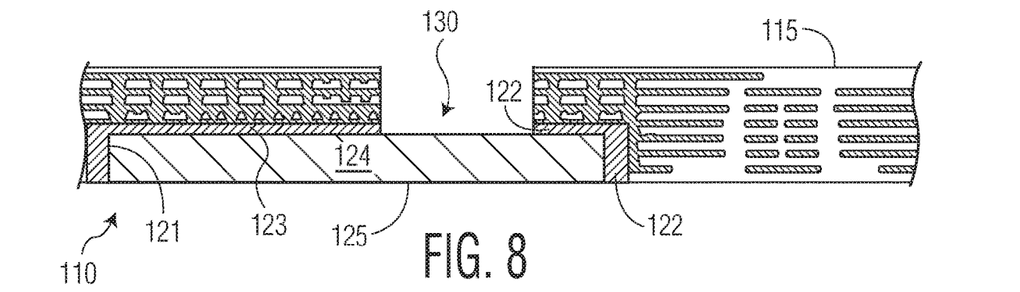
FIG. 8 is a cross-sectional side view diagram of a slice of the substrate with a recess formed over the thermal dissipation structure in accordance with an embodiment of the invention.

As shown in FIG. 8, as an alternative or in addition to mounting the die 134 of FIG. 7 at the top of the substrate, a recess 130 with a size suitable for accommodating a die is formed through the mounting surface 115 of the substrate 110 over the thermal dissipation structure 124 using any of the material removal techniques described herein. The substrate material is removed to expose an "interior surface" of the thermal dissipation structure 124 that is opposite the thermal dissipation structure's outer surface 125. The material removal may include removing a portion of the sinter precursor material 122 that is exposed through the recess 130. In embodiments in which the recess 130 is etched into the substrate 110, the thermal dissipation structure 124 may be used as an etch stop for etching processes so that all material above the thermal dissipation structure 124 may be efficiently removed.

FIG. 8 shows only a slice of the substrate 110 so that the recess 130 appears open with no back side wall. In some embodiments, the recess 130 may extend all the way to the interior surface 123 of the first recess 120, as it appears in the drawing. Further, in some embodiments, the recess 130 will have interior sidewalls on all four side and not only the two sides as shown. The recess 130 may also have more than four sidewalls and may be formed in other shapes than the rectangular shape shown.

Figure 9:
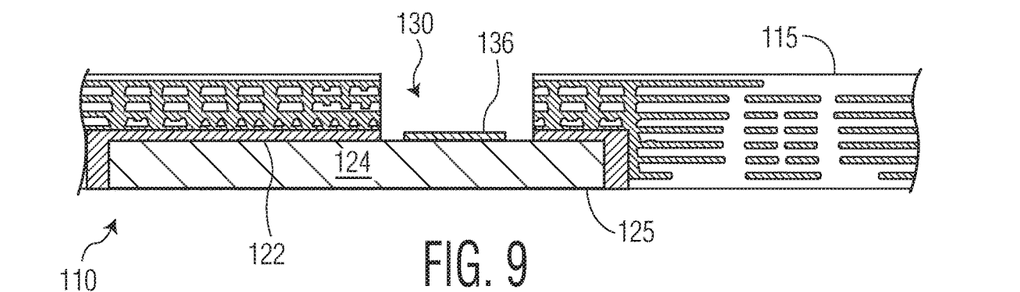
FIG. 9 is a cross-sectional side view diagram of a slice of the substrate with a die attach material applied over the thermal dissipation structure in the recess in accordance with an embodiment of the invention.

As shown in FIG. 9 which is also a cross-sectional side view of a slice of the substrate 110, a device bond layer 136, which may more specifically be a die attach material, is deposited over the thermal dissipation structure 124 in the die recess 130. In some embodiments, the device bond layer 136 may be composed of a non-sintered material, such as a die attach epoxy, which is deposited onto the interior surface of the thermal dissipation structure 124 before or after the thermal dissipation structure 124 is inserted in the recess 120 over the sintered precursor material 122. In some embodiments, the device bond layer 136 also is a sinter precursor material, which is similar or substantially identical to the layer of sinter precursor material 122 that attaches the thermal dissipation structure 124 to the substrate 110.

The device bond layer 136 may be applied as a patterned layer (e.g., as an applied film or as a deposited paste layer) over the upper surface of the thermal dissipation structure 124 or in another suitable way, depending on the implementation. The device bond layer is configured to a have a high thermal conductivity so that it is able to conduct heat away from a microelectronic device. Other suitable bonding materials include solder materials, thermally-conductive die attach materials, metal-filled epoxies, and sintered metallic materials. When used, a solder material may be reflowed at the same time that other solder contacts used to electrically connect other microelectronic components are reflowed.

Figure 10:
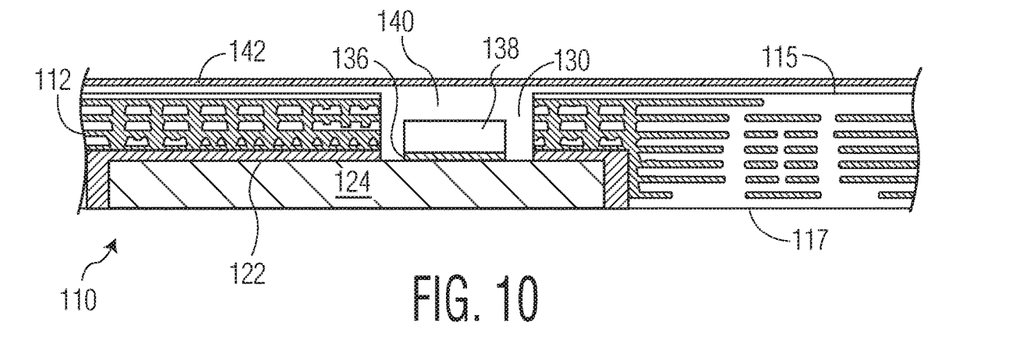
FIG. 10 is a cross-sectional side view diagram of a completed structure with a die attached to the thermal dissipation structure in the recess and a cover over the recess in accordance with an embodiment of the invention.

As shown in FIG. 10, a die 138 is placed over a die attach material, such as the device bond layer 136 and bonded to the thermal dissipation structure 124 by the device bond layer 136. When the device bond layer 136 is composed of a sinter precursor material, the assembly may then be sintered to simultaneously bond the thermal dissipation structure 124 to the substrate 110 and to bond the die 138 to the thermal dissipation structure 124. One or more other microelectronic devices including die, discrete components and passive components may be mounted to the same or to another thermal dissipation structure 124, and/or to the mounting surface 115 of the substrate 110. An additional heatsink (not shown) may be attached to the non-mounting surface 117 and the outer surface 125 of the thermal dissipation structure 124 to dissipate heat conveyed through the thermal dissipation structure 124.

Die 138 may be, for example, a semiconductor die having one or more active devices (e.g., power transistors) and an active surface (e.g., top surface in FIG. 10) on which one or more groups (e.g., rows or clusters) of bond pads are located. The bond pads may be electrically coupled to electrically-conducive traces and/or bond pads formed in or on the substrate by wire bonds (not shown). Other electrical interconnection approaches may be used to suit different applications. Additional microelectronic modules, die, and/or devices may be attached to the same or to a different thermal dissipation structure 124 on the same substrate, and/or to the mounting surface of the substrate, as a multiple die module or SiP configuration. Attached die and devices may include one or more of a processor, a controller, an RF front-end, a signal processor, a memory die, an ASIC die, a MEMS device, and a SMD, such as discrete or passive capacitors (e.g., chip caps), inductors, resistors, and diodes, inter alia.

The finished structure including the die 138 and substrate 110 may include various other structural features in further embodiments. For example, a window frame may be positioned around the recess 130 and a lid may be positioned over the substrate 110 to enclose the microelectronic device. Alternatively, an encapsulant body 140 may be formed over the substrate and around the die. Other sintered metal structures may also be added, if desired. For example, a sintered metal RF shield layer may be formed over an encapsulant body opposite the die (not shown). The sintered metal RF shield layer may be formed by depositing a sinter precursor material and then sintering the precursor material with the die attach material as described herein. In another embodiment, a material is overmolded over the substrate 110 and the die to form an encapsulant body, a layer of sinter precursor material 142 is then applied to the uppermost surface of the encapsulant 140 as a continuous paste layer or transferred film, and another sintering process is then carried-out to transform the layer of sinter precursor material 142 to an RF shield layer.

In an embodiment, a low temperature sintering process is applied to the assemblies shown in FIG. 6, FIG. 7 or FIG. 10, depending on the implementation, to produce the desired metal sinter layers after application of the sinter precursor material and, in some embodiments, to also attach the die. The low temperature sintering process may be carried out under any process conditions suitable for transforming the sinter precursor material into metal sinter layers, noting that some diffusion may occur from the precursor material into contacting components of the microelectronic modules. The sinter bond process thus advantageously forms low stress, mechanically-robust, solid-state metallurgical diffusion bonds at the bond joint interfaces. The sintering process may be performed with or without pressure, with or without heating (although some degree of elevated heat will typically be applied), and in any suitable atmosphere (e.g., open air or in the presence of an inert gas, such as nitrogen).

The sintering process may be carried-out at maximum processing temperatures (TMAX) that are less than the melting point of the metal particles contained within the precursor material. In some embodiments, TMAX will be significantly less than the melting point of the metal particles and, perhaps, less than one half the melting point of the particles considered on an absolute temperature scale (in Kelvin). Generally, TMAX will be greater than standard room temperature (e.g. 20° C.) and less than 300° C. Comparatively, the melt point of Ag, Au, and Cu particles in a nanometer or micron size range will commonly range between approximately 950° C. to 1100° C. To provide a still further example, TMAX may be between approximately 170° C. and 300° C. in an embodiment. In still further embodiments, TMAX may be greater than or less than the aforementioned range, providing that TMAX (in conjunction with the other process parameters) is sufficient to induce sintering of the metal particles without liquefaction of the metal particles.

A multistage heating schedule may be employed during the sintering process. In this case, the multistage heating schedule may entail heating the assembly with the substrate and the thermal dissipation structure and, in some embodiments, the semiconductor die, in a partially fabricated state, to a first temperature (T1) less than TMAX for a first time period, gradually increasing or ramping-up the temperature process to TMAX, and then maintaining TMAX for a second time period. A cool down period may follow. In one embodiment, and by way of non-limiting example only, T1 may range from approximately 100 to 200° C., while TMAX is greater than T1 and ranges from approximately 170 to 280° C. The process parameters employed may or may not be controlled to fully decompose any organic material from the sinter precursor material during the sintering process.

In some embodiments, a controlled convergent pressure or compressive force is applied across the partially-fabricated assembly during the sintering process. When applied, the convergent pressure may be delivered as a substantially constant force or, instead, varied in accordance with a time-based or temperature-based schedule. Any suitable mechanism may be used to apply the desired convergent pressure including bulk weights, resilient bias devices (e.g., spring-loaded plungers or pins), clamps, hydraulic presses, and the like. The pressure applied may be selected based upon various factors including the desired final thickness of the metal sinter layers, the desired porosity of the metal sinter layers, and the composition of the sinter precursor material. In one embodiment, and by way of non-limiting example only, a maximum pressure (PMAX) ranging between about 0.5 and about 20 megapascal (Mpa) is applied during the sintering process. In other embodiments, PMAX may be greater than or less than the aforementioned range, if pressure is applied during the sintering process.

Figure 11:
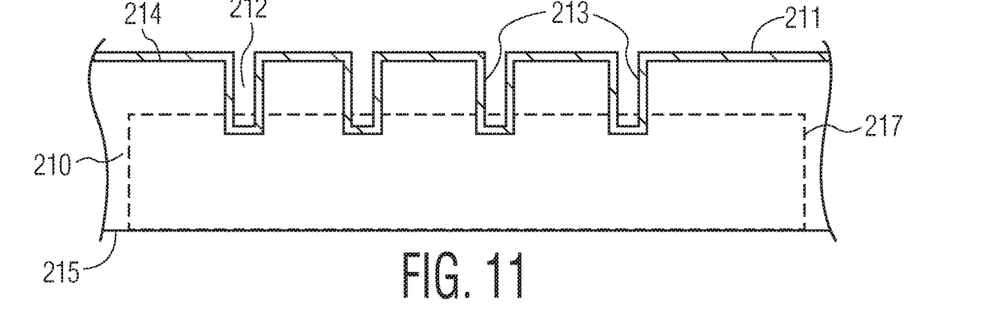
FIG. 11 is a cross-sectional side view diagram of a slice of an alternative substrate with thermal vias in accordance with an embodiment of the invention.

FIGS. 11-14 illustrate several sequential steps of manufacture of a second embodiment of a substrate with thermal vias and a sinter-bonded metal thermal dissipation structure, in accordance with another embodiment. More specifically, FIG. 11 is a cross-sectional side view diagram of a slice of an alternative substrate 210 at a first stage of manufacture. The substrate 210 has a mounting surface 214, a non-mounting surface 215, opposite the mounting surface, and a plurality of thermal vias 212 that are hollow at this stage and extend from the mounting surface 214 partially or completely through the substrate 210. The diagram shows only a slice of the substrate 210 so that the thermal vias 212 appear as open slots through the entire substrate with no back side wall. While, in some embodiments, the thermal vias 212 may be bar-shaped as shown in FIG. 4 and extend horizontally across an entirety of the mounting surface 214 of the substrate 210 as it appears in the drawing, in other embodiments the thermal vias 212 will have interior sidewalls 213 on all four sides (or around an entire circumference in the case of circular vias) and not only the two sides as shown.

The thermal vias 212 may be formed by drilling, etching, or in a variety of other ways. The thermal vias 212 may be circular, elliptical, bar-shaped or have any other configuration. The thermal vias 212 may be plated with a conductive layer 211 by deposition or another technique on all interior sidewalls 213 of each thermal via 212. The mounting surface 214 of the substrate is shown as also having the conductive layer 211 that may be patterned and may serve as a routing layer, a ground plane, an RF shield, or a bonding layer.

In some embodiments, the thermal vias 212 form a plurality of conductive features that extend from the mounting surface 214 of the substrate 210 toward but not to, or through, the non-mounting surface 215 on an opposite side of the substrate. There may be one or more patterned routing or cooling layers (not shown) embedded within the substrate 210 between the mounting surface 214 and non-mounting surface 215 at the top and bottom, respectively, of the substrate. The thermal vias 212 have a first end that is substantially co-planar with or open at the mounting surface 214, and a second end that is or will be made substantially co-planar with an interior surface 221 of a recess (e.g., recess 216, FIG. 12). The thermal vias 212 may have any of various configurations and cross-sectional shapes. The thermal vias 212 may include an array of circular, rectangular, elliptical, bar or other shapes in the substrate 210.

Figure 12:
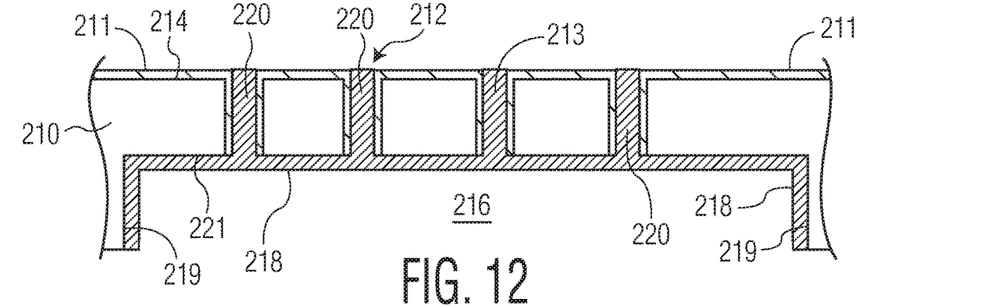
FIG. 12 is a cross-sectional side view diagram of the alternative substrate with a recess and a sinter precursor material plating the recess and filling the thermal vias in accordance with an embodiment of the invention.

FIG. 12 is a diagram of the substrate of FIG. 11 in a further operation in which a recess 216 is formed in the substrate at a subsequent stage of manufacture. This recess 216 may be formed using methods as described with reference to FIG. 2, and may include removing portions of the substrate as indicated by cut line 217 of FIG. 11. A sinter precursor material 218 is formed on the sidewalls 219 and the interior surface 221 of the recess 216 as described above, and the sinter precursor material 218 also is disposed into the open, interior ends of the thermal vias 212 to fill the thermal vias 212 with a via filling 220. In alternate embodiments, the thermal vias 212 may be filled with conductive material before forming the recess 216 and/or applying the sinter precursor material 218.

The mounting surface 214 supports the patterned conductive layer 211. As shown in FIG. 12, the conductive layer 211 also is thermally and electrically coupled to the via filling 220. The conductive layer 211 may be composed of a metallic material, such as Al, Cu, nickel (Ni), and alloys thereof. However, the layer may also be produced from certain composite materials and non-metallic materials having relatively high thermal conductivities. Such materials may include, but are not limited to, diamond polycarbonate materials, diamond-metal composites (e.g., diamond Au, diamond Ag, and diamond Cu), pyrolytic graphite, and materials containing allotropes of carbon, such as graphene and carbon nanotube-filled materials.

Figure 13:
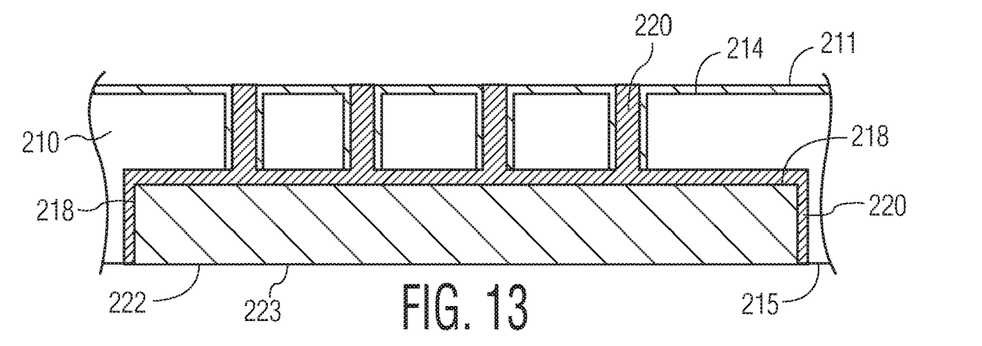
FIG. 13 is a cross-sectional side view diagram of the alternative substrate with a thermal dissipation structure placed in the recess in accordance with an embodiment of the invention.

FIG. 13 shows the substrate 210 at a subsequent stage of manufacture after a thermal dissipation structure 222 has been placed in the recess 216 over a coating of the sinter precursor material 218. In this example, the thermal dissipation structure 222 fills the recess 216 and has a bottom surface 223 that is substantially co-planar with the non-mounting surface 215 of the substrate. After a sintering process has been performed on the assembly, the bottom surface 223 may be further refined with grinding or polishing, such as with CMP, laser ablation or another technique.

In some embodiments, the thermal vias 212 operate as thermal dissipation structures when filled that are partially composed of the sintered material bonded to the substrate 210. The sintered material fills the formerly hollow, lined structure of the thermal vias 212. The thermal dissipation structure 222 is thermally coupled to the substrate 210 and the thermal vias 212 by the sinter precursor material 218 after sintering. In this manner, the structure provides a robust thermal transfer path promoting efficient conduction of heat from a die attached to the mounting surface 214 through the thermal vias 212 to the thermal dissipation structure 222.

An additional heatsink (not shown) may be attached to the non-mounting surface 215 and the exposed surface of the thermal dissipation structure 222 to dissipate heat conveyed through the thermal dissipation structure 222. Such a heatsink may have a material volume greater than that of the substrate 210. Such a heatsink may be bonded to the non-mounting surface 215 of the substrate 210 and to the bottom surface 223 of the thermal dissipation structure 222 by a heatsink bond layer which may be formed from the same type of sinter precursor material used to connect the thermal dissipation structure 222 to the substrate 210 and/or to fill the thermal vias 212, or may be formed from a different type of thermally conductive material.

Figure 14:
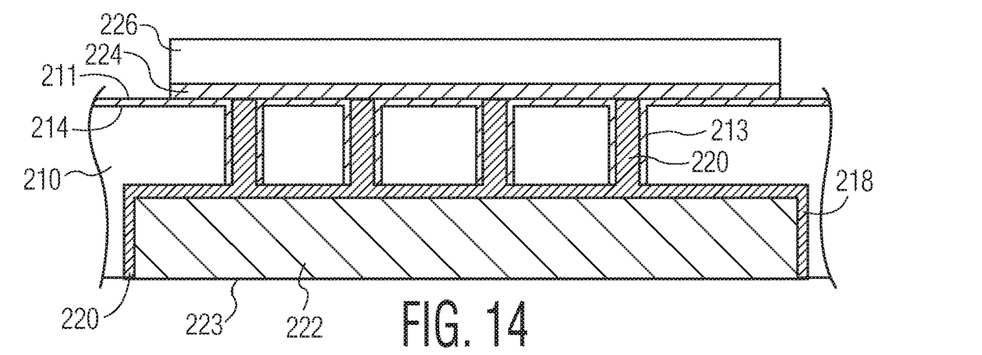
FIG. 14 is a cross-sectional side view diagram of a completed structure with a die attached to the thermal vias in accordance with an embodiment of the invention.

FIG. 14 shows the substrate 210 at a subsequent stage of manufacture after a die attach material 224 is optionally applied to the mounting surface 214 over the thermal vias 212, and a die 226 is optionally applied to the die attach material 224. In embodiments in which the die attach material 224 is a sinter precursor material, a sintering process may then be performed on the assembly to form metallurgical bonds between the substrate 210, the thermal dissipation structure 223, the thermal vias 212, the via filling 220, and the die 226. Alternatively, the sintering process used to couple the thermal dissipation structure 222 to the substrate 210 may be separate from the subsequently-performed die attach process, which may instead include a solder reflow or other die attach process. This structure provides a solid foundation for the die with heat conduction. Additional die may be mounted to the mounting surface 214 of the substrate and, when included, to other sets of thermal vias. Contact pads (not shown) on the mounting surface 214 may be provided for electrical connections. In addition, die covers may be added as described above, such as plastic covers or encapsulant.

Figure 15:
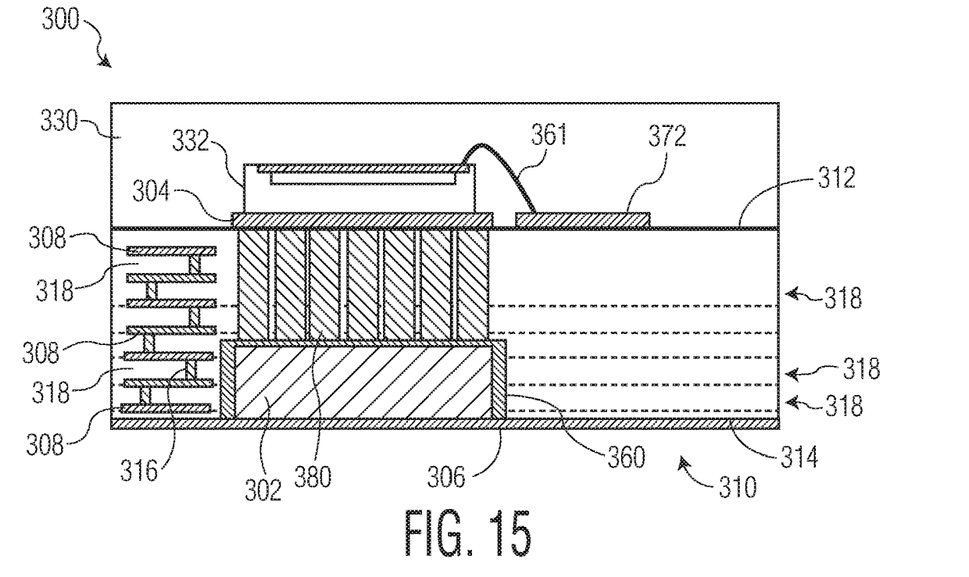
FIG. 15 is a cross-sectional side view diagram of a further alternative substrate with an amplifier die attached over thermal vias with wire bond leads to a landing pad in accordance with an embodiment of the invention.

FIG. 15 is a cross-sectional side view diagram of a power amplifier module 300 that includes an amplifier die 332 attached to a set of thermal vias 380 as described herein. In some embodiments, the die is a part of power amplifier module, such as a Doherty amplifier. In other embodiments, any other suitable amplifier or other type of die may be used. The power amplifier module 300 includes a substrate 310 and an amplifier die 332, which is electrically coupled by, for example, a wire bond 361, to a conductive transmission line 372 on the component mounting surface 312 of the substrate. The module may also include other components, not shown in this view, to fully implement the Doherty amplifier such as a power splitter, a second amplifier die, a phase shift and impedance inversion structure, and various other circuit elements.

In the example of FIG. 15, the power amplifier module 300, may be implemented as a land grid array (LGA) module. Accordingly, the substrate 310 has a component mounting surface 312 (also referred to herein as an "upper" or "top" surface) and a land surface 314 (also referred to herein as a "lower" or "bottom" surface). Conductive landing pads of the LGA are exposed at the land surface 314. Alternatively, the power amplifier module may be packaged as a pin grid array module, a dual or quad flat no leads (DFN or QFN) module, or another type of package. Either way, the component mounting surface 312 and the components mounted to that surface optionally may be covered with an encapsulant material (e.g., encapsulant material 330, such as a plastic or epoxy resin encapsulant). In an alternate embodiment, the components may be contained within an air cavity, which is defined by various structures (not illustrated) overlying the component mounting surface 312.

The substrate 310 may be a multi-layer organic substrate (e.g., formed from PCB materials, such as pre-preg and Cu), which includes a plurality of metal layers 308 that are separated by (or interleaved with) a plurality of dielectric material layers 318. Conductive vias (e.g., via 316), which extend through the dielectric material layers 318, provide for electrical connectivity between the metal layers 308.

In an embodiment, the substrate 310 includes a plurality of electrically and thermally conductive vias 380 (i.e., thermal vias) arranged as a via farm that are coupled to a thermal dissipation structure 302 connected (e.g., sinter bonded) within a recess in the non-mounting surface 314 of the substrate below die 332. The thermal dissipation structure 302 and the amplifier die 332 may both be attached to the substrate 310 (e.g., with solder, brazing material, sinter material, and/or other materials). The thermal dissipation structure 302 is electrically and thermally coupled to the thermal vias 380 with a sintered metal bond layer 360. The thermal vias 380 may be filled with sintered metal or other metals, and extend from the thermal dissipation structure 302 through the substrate 310 to the component mounting surface 312 at the top of the substrate. Thus, the thermal vias 380 and a die attach layer 304 are thermally and electrically connected to provide heat dissipation structures and ground reference access to the amplifier die 332 and any other similarly situated die.

Some metal layers 308 of the substrate may be used to convey DC voltages (e.g., DC bias voltages) and to provide access to a system ground reference. Other metal layers 308 may be used to convey RF and other signals to the power amplifier module 300. Additionally, a patterned metal layer may be formed on the component mounting surface 312 of the substrate. As discussed above, the patterned metal layer may include a plurality of conductive contacts and traces on the component mounting surface 312, which facilitates electrical connections to die and other components that may be coupled to the component mounting surface 312.

Although the substrate 310 is depicted to include seven metal layers 308 and seven dielectric material layers 318, substrates that include more or fewer metal layers and/or more or fewer dielectric material layers alternatively may be used. Either way, each of the dielectric material layers 318 may have a thickness (vertical dimension) in a range of about 30 microns to about 100 microns, although the thickness of each dielectric material layer 318 may be smaller or larger, as well. In some embodiments, each of the dielectric material layers 318 have substantially the same thickness, while in other embodiments, the dielectric material layers 318 may have different thicknesses.

As indicated previously, the power amplifier module 300 may be connected to another system substrate (not illustrated), such as a PCB, which provides the system ground reference. For example, a system ground plane may be located at the top surface of the system substrate to which the land surface 314 of the power amplifier module 300 is connected. In an embodiment, as mentioned above, an additional metal layer 306 may be connected to or applied to the land surface 314 of the substrate 310 and may also cover the thermal dissipation structure 302. This additional metal layer 306 may be physically and electrically coupled to the system ground plane (or reference). In other embodiments, the additional metal layer 306 may be excluded from the power amplifier module 300 and conductive features exposed at the land surface 314 of the substrate 310 (e.g., including the bottom surface of the heat dissipation structure 302) may be directly coupled to the system ground plane.

Figure 16:
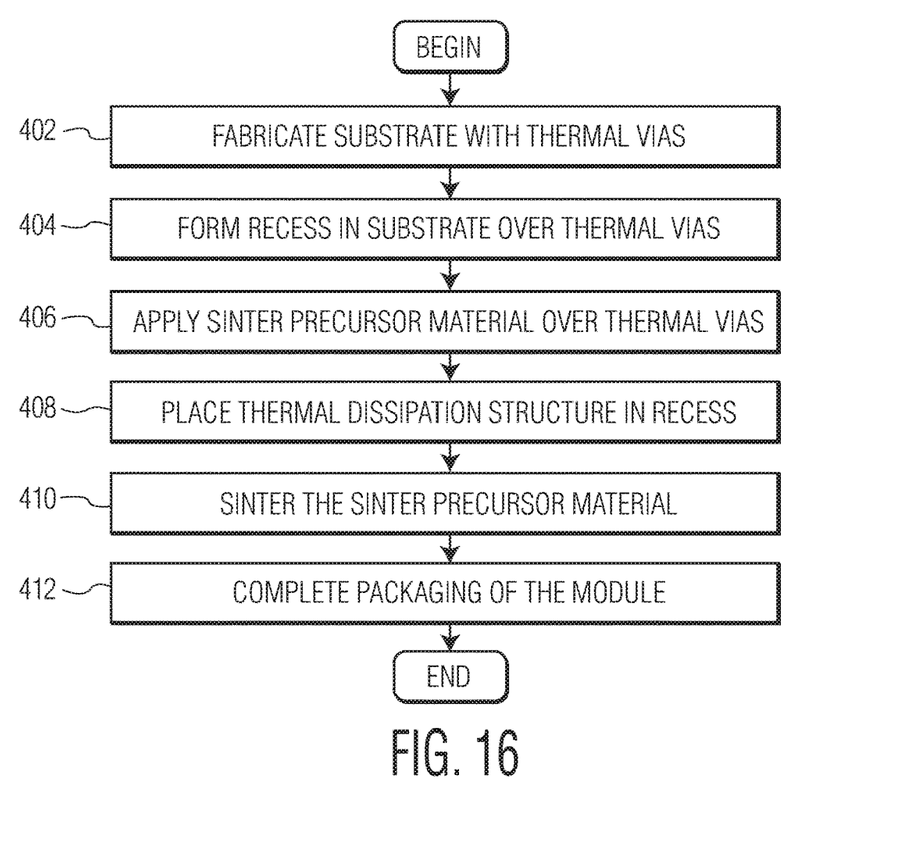
FIG. 16 is a process flow diagram of producing a die package in accordance with an embodiment of the invention.

FIG. 16 is a process flow diagram of operations described above to fabricate a substrate with a sintered thermal dissipation structure. At 402, a substrate is fabricated that includes filled or hollow (unfilled) thermal vias. The substrate may be a PCB, a coreless substrate, a silicon substrate or another suitable kind of substrate. The thermal vias may be formed along with build-up layers of the substrate or added later by drilling or other techniques. The vias may be arranged as a via farm, and may be circular, rectangular, or bar shaped in cross-section.

At 404, a recess is formed in a non-mounting surface of the substrate over one or more thermal vias, such as by etching or sawing. The thermal vias are within the substrate and configured to conduct heat away from a die pad or toward a thermal dissipation structure.

At 406, a sinter precursor material is applied in the recess so that the sinter bond material physically contacts at least a portion of the thermal vias (e.g., interior ends of the thermal vias that are exposed at an interior surface of the recess). In some embodiments, as described previously, the thermal vias may be filled with the sinter bond material simultaneously with applying the sinter precursor material in the recess.

At 408, a thermal dissipation structure, for example a metal slug or coin is placed into the recess over the sinter precursor material. The thermal dissipation structure may comprise at least one of Cu, Al, and an alloy with an appropriate coefficient of thermal expansion. Alternatively, the thermal dissipation structure may be formed from other suitable materials, as mentioned above. The thermal dissipation structure may have a prefabricated solid body having a thermal conductivity that is greater than that of the substrate.

At 410, the sinter precursor material is sintered using above-described sintering processes. This sinters (i.e., permanently attaches) the thermal dissipation structure within the recess to at least a portion of the thermal vias. There may be additional components added to the substrate before the sintering such as additional thermal dissipation structures, additional die, passive components, wire bond leads, etc. As shown in previously-described figures, a die may be mounted to a mounting surface of the substrate over the thermal vias (i.e., overlying the thermal dissipation structure), or in other embodiments, an additional recess may be formed through the mounting surface of the substrate, and a die may be mounted to a portion of the thermal dissipation structure that is exposed through the additional recess. The die may be attached by the sintering operation or using other die bonding techniques and materials.

At 412, the package of the module is finished with wire bonds, covers, encapsulant, heat sinks, additional components, and/or any other desired operations to finish the device.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It will be readily understood that the components of the embodiments as generally described herein and illustrated in the appended figures may be arranged and designed in a wide variety of different configurations. Thus, the more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention may be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment. Although specific embodiments of the invention have been described and illustrated, the invention is not to be limited to the specific forms or arrangements of parts so described and illustrated. The scope of the invention is to be defined by the claims appended hereto and their equivalent.

What is claimed is:

1. A microelectronic module comprising:
   a substrate having a first substrate surface, a second substrate surface, and a recess in the second substrate surface, wherein the recess is partially defined by an interior recess surface that is between the first and the second substrate surfaces;
   one or more thermal vias extending between the first substrate surface and the interior recess surface, wherein each of the thermal vias has a first end that is co-planar with and open at the first substrate surface, and an interior end that is open and exposed at the interior recess surface;
   a sintered metal layer in the recess and in physical contact with the interior end of the thermal vias;
   sintered via filling that fills the thermal vias; and
   a thermal dissipation structure in the recess over the sintered metal layer, wherein the thermal dissipation structure is attached to the substrate within the recess by the sintered metal layer, and the thermal dissipation structure is thermally coupled to the sintered via filling within the thermal vias through the sintered metal layer.

2. The microelectronic module of claim 1, wherein the substrate includes one or more dielectric layers and one or more conductive layers.

3. The microelectronic module of claim 1, wherein interior sidewalls of at least some of the thermal vias are plated with a conductive layer.

4. The microelectronic module of claim 1, wherein the thermal vias comprise a plurality of vertical structures interconnected with a plurality of horizontal conductive layers.

5. The microelectronic module of claim 1, wherein the thermal vias are configured as at least one of circular, rectangular and bar shapes.

6. The microelectronic module of claim 1, wherein the thermal dissipation structure comprises at least one of copper (Cu), aluminum (Al), and an alloy.

7. The microelectronic module of claim 1, wherein the thermal dissipation structure comprises a prefabricated solid body having a thermal conductivity that is greater than that of the substrate.

8. The microelectronic module of claim 1, wherein the sintered metal layer and the sintered via filling are formed from a sinter precursor material of a paste with metal particles of at least one of gold (Au), silver (Ag), and copper (Cu).

9. The microelectronic module of claim 1, further comprising a die pad on the substrate opposite the thermal dissipation structure and thermally coupled to the thermal vias and a die attached to the die pad.

10. The microelectronic module of claim 9, further comprising a heat sink thermally coupled to the thermal dissipation structure to absorb heat from the die through the thermal vias.

11. A microelectronic module comprising:
- a substrate having a first substrate surface, a second substrate surface, and a recess in the second substrate surface, wherein the recess is partially defined by an interior recess surface that is between the first and the second substrate surfaces;
- one or more thermal vias extending between the first substrate surface and the interior recess surface, wherein the thermal vias have an interior end exposed at the interior recess surface;
- a sintered metal layer in the recess and in physical contact with the interior end of the thermal vias;
- a thermal dissipation structure in the recess over the sintered metal layer, wherein the thermal dissipation structure is attached to the substrate within the recess by the sintered metal layer, and the thermal dissipation structure is thermally coupled to the thermal vias through the sintered metal layer;
- a second recess in the first substrate surface extending from the first substrate surface to the thermal dissipation structure;
- a thermally conductive die pad in the recess on the thermal dissipation structure; and
- a die attached to the thermally conductive die pad.

* * * * *